(12) United States Patent
Chang et al.

(10) Patent No.: US 11,927,634 B2
(45) Date of Patent: Mar. 12, 2024

(54) SYSTEMS AND METHODS FOR DATABASE SCAN ACCELERATION

(71) Applicant: Samsung Electronics Co., Ltd., Gyeonggi-do (KR)

(72) Inventors: Andrew Chang, Los Altos, CA (US); Jingchi Yang, Sunnyvale, CA (US); Vinit Apte, San Jose, CA (US); Brian Luu, Fremont, CA (US)

(73) Assignee: Samsung Electronics Co., Ltd (KR)

( * ) Notice: Subject to any disclaimer, the term of this patent is extended or adjusted under 35 U.S.C. 154(b) by 84 days.

(21) Appl. No.: 17/830,854

(22) Filed: Jun. 2, 2022

(65) Prior Publication Data

US 2023/0314511 A1    Oct. 5, 2023

Related U.S. Application Data

(60) Provisional application No. 63/326,341, filed on Apr. 1, 2022.

(51) Int. Cl.
*G01R 31/3185* (2006.01)
*G01R 31/317* (2006.01)
*G01R 31/3177* (2006.01)

(52) U.S. Cl.
CPC ........ *G01R 31/318597* (2013.01); *G01R 31/31713* (2013.01); *G01R 31/3177* (2013.01); *G01R 31/318536* (2013.01)

(58) Field of Classification Search
CPC ...... G01R 31/318597; G01R 31/31713; G01R 31/3177; G01R 31/318536
USPC ............................... 714/726, 729, 732, 742
See application file for complete search history.

(56) References Cited

U.S. PATENT DOCUMENTS

| | | | | |
|---|---|---|---|---|
| 5,870,097 A | * | 2/1999 | Snyder | G06T 13/80 345/422 |
| 5,977,977 A | * | 11/1999 | Kajiya | G06T 11/40 345/418 |
| 6,263,396 B1 | * | 7/2001 | Cottle | H04N 21/42653 348/E5.005 |
| 8,130,825 B2 | * | 3/2012 | Scheuermann | H04N 21/4341 348/390.1 |
| 8,165,988 B2 | | 4/2012 | Shau et al. | |

(Continued)

FOREIGN PATENT DOCUMENTS

EP           4 224 336           8/2023

OTHER PUBLICATIONS

Zsolt István et al., "Caribou: Intelligent Distributed Storage", Proceedings of the VLDB Endowment, vol. 10, Issue 11, Aug. 1, 2017, pp. 1202-1213.

(Continued)

*Primary Examiner* — John J Tabone, Jr.
(74) *Attorney, Agent, or Firm* — The Farrell Law Firm, P.C.

(57) ABSTRACT

A method and a memory device are provided. Data is obtained for a scan operation at an input buffer of a scan kernel in the memory device. The input buffer is adaptable to a first mode and a second mode of the scan kernel. Preprocessing of the data from the input buffer is performed to generate preprocessed data. A different type of preprocessing is performed for the first mode and the second mode. The preprocessed data is filtered to generate a filtered result. The filtered result is provided from the scan kernel to a controller of the memory device.

20 Claims, 9 Drawing Sheets

(56) References Cited

U.S. PATENT DOCUMENTS

| | | |
|---|---|---|
| 8,244,718 B2 | 8/2012 | Chamdani et al. |
| 8,631,000 B2 | 1/2014 | Franke et al. |
| 8,838,577 B2 | 9/2014 | Sukhwani et al. |
| 8,862,625 B2 | 10/2014 | Meiyyappan et al. |
| 9,063,974 B2 | 6/2015 | Aingaran et al. |
| 9,141,670 B2 | 9/2015 | Branscome et al. |
| 9,378,231 B2 | 6/2016 | Yang et al. |
| 9,411,524 B2 | 8/2016 | O'Hare et al. |
| 10,803,066 B2 | 10/2020 | Shau et al. |
| 2003/0167365 A1* | 9/2003 | Kubalska .......... G09G 5/363 710/113 |
| 2013/0304742 A1 | 11/2013 | Roman et al. |
| 2014/0157370 A1* | 6/2014 | Plattner .......... H04L 63/06 726/4 |
| 2016/0306922 A1* | 10/2016 | van Rooyen .......... G16B 50/30 |
| 2018/0082400 A1* | 3/2018 | Lim .......... G06T 5/20 |
| 2018/0373760 A1 | 12/2018 | Verma et al. |
| 2019/0188132 A1 | 6/2019 | Yap et al. |
| 2020/0301898 A1 | 9/2020 | Samynathan et al. |
| 2021/0042280 A1* | 2/2021 | Sharma .......... G06F 16/24552 |
| 2021/0073226 A1 | 3/2021 | Chavan et al. |
| 2021/0097047 A1 | 4/2021 | Billa et al. |
| 2021/0271680 A1 | 9/2021 | Lee et al. |
| 2023/0314511 A1* | 10/2023 | Chang .......... G01R 31/31713 714/726 |

OTHER PUBLICATIONS

Jun Heo et al., "BOSS: Bandwidth-Optimized Search Accelerator for Storage-Class Memory", 2021 ACM/IEEE 48th Annual International Symposium on Computer Architecture (ISCA), Jun. 14, 2021, pp. 279-291.

Bharat Sukhwani et al., "A Hardware/Software Approach for Database Query Acceleration with FPGAs", Int. Journal of Parallel Programming, 2015, 31 pages.

European Search Report dated Sep. 14, 2023 issued in counterpart application No. 23164736.3-1203, 8 pages.

* cited by examiner

SYSTEMS AND METHODS FOR DATABASE SCAN ACCELERATION

PRIORITY

This application is based on and claims priority under 35 U.S.C. § 119(e) to U.S. Provisional Patent Application Ser. No. 63/326,341, filed on Apr. 1, 2022, the entire contents of which are incorporated herein by reference.

TECHNICAL AREA

The present disclosure relates generally to database scanning, and more particularly, to a method and scalable streaming architecture that accelerates scan operations.

BACKGROUND

A sequential scan operation demands low computational intensity and high data throughput from memory and storage devices. Software implements these operations by first moving data from a storage device to a host memory. A sequential scan operation is then performed from the host memory using central processing unit (CPU) instructions, and storage results are provided back to the host memory. The time that is required to move data to the host memory becomes a bottleneck for datacenter online analytical processing (OLAP) workload.

Postgres, an object-relational database system, also poses a challenge to existing OLAP workload with its complex and flexible data page format and its row-based data format. These characteristics make a scan operation hard to accelerate in hardware because items in a same row are closely coupled in a scan and filtering operation.

SUMMARY

Embodiments use computational storage smart devices to perform a sequential scan plus filtering operation in hardware near the data storage device, thereby reducing power consumption through reduced data movement, while also enabling a parallel processing architecture that is not available in CPU instructions.

According to an embodiment, a method of a memory device is provided. Data is obtained for a scan operation at an input buffer of a scan kernel in the memory device. The input buffer is adaptable to a first mode and a second mode of the scan kernel. Preprocessing of the data from the input buffer is performed to generate preprocessed data. A different type of preprocessing is performed for the first mode and the second mode. The preprocessed data is filtered to generate a filtered result. The filtered result is provided from the scan kernel to a controller of the memory device.

According to an embodiment, a memory device is provided that includes a controller and scan kernel hardware. The scan kernel hardware is configured to obtain data for a scan operation at an input buffer. The input buffer is adaptable to a first mode and a second mode of a scan kernel. The scan kernel hardware is also configured to perform preprocessing of the data from the input buffer to generate preprocessed data. A different type of preprocessing is performed for the first mode and the second mode. The scan kernel hardware is further configured to filter the preprocessed data to generate a filtered result, and provide the filtered result from the scan kernel to the controller.

According to an embodiment, a memory device is provided that includes a controller, a network on chip (NoC), and scan kernel hardware. The scan kernel hardware is configured to perform preprocessing of data, received via the NoC, using an input buffer to generate preprocessed data. The input buffer is adapted differently for a first mode and a second mode of a scan kernel. The scan kernel hardware is also configured to filter the preprocessed data to generate a filtered result, and provide the filtered result from the scan kernel to the controller, via the NoC.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
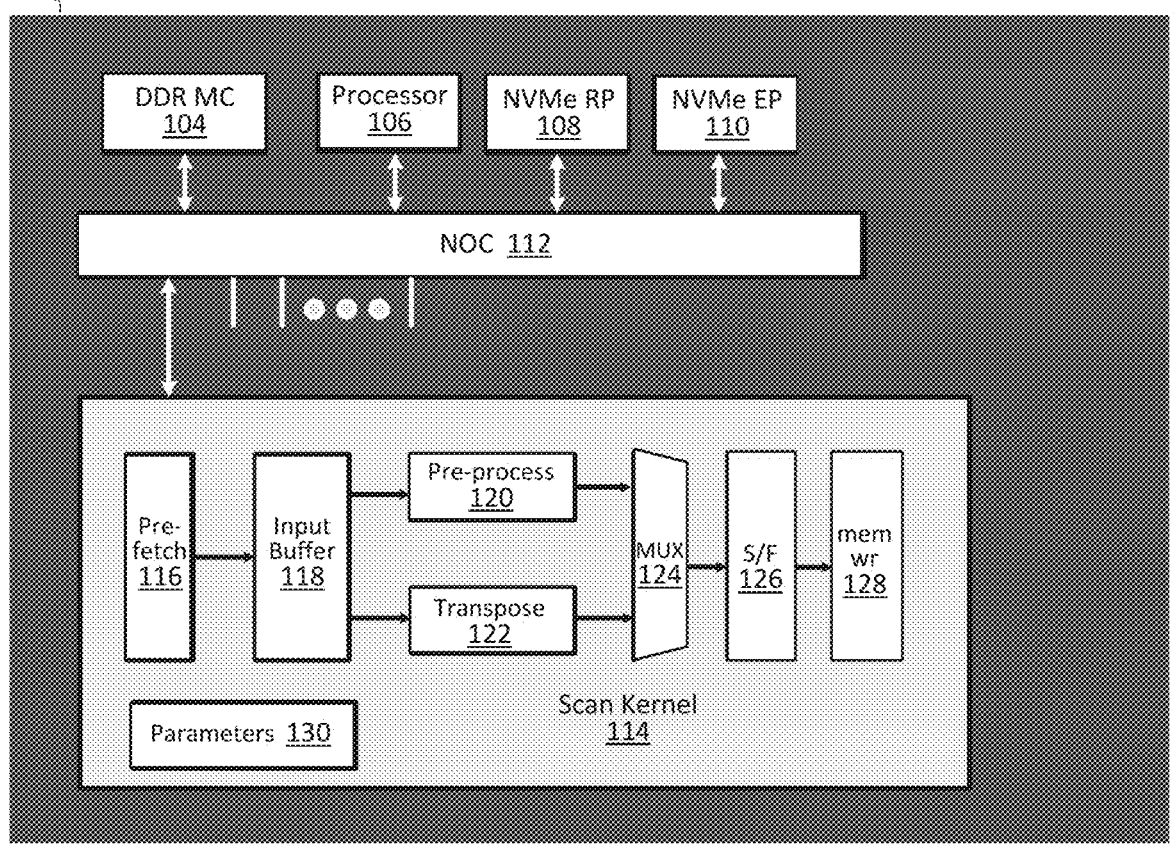
FIG. 1 is a diagram illustrating a system architecture of a storage device, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device, according to one embodiment, may be one of various types of electronic devices utilizing storage devices and/or non-volatile memory express (NVMe). The electronic devices may include, for example, a portable communication device (e.g., a smart phone), a computer, a portable multimedia device, a portable medical device, a camera, a wearable device, or a home appliance. However, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, firmware, or combination thereof, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

A sequential scan operation is a computationally intensive operation type for a software-based solution. CPU resources and energy are lost in a data center due to inefficient software solutions. Embodiments herein take advantage of a scalable hardware architecture offered by a computation storage framework that keeps data movement to a minimum. Software/hardware co-design and data parallelism are utilized to balance performance and flexibility in this scalable hardware architecture.

Embodiments implement a scalable streaming architecture to accelerate sequential scan operations. The architecture separates a scan function from a data prefetching and preprocessing engine. Therefore, the architecture hides data fetching latency and removes data format dependency to a row-based database, such as, for example, Postgres, or column-based database format. Additionally, parallel scan and filtering paths support streaming processing without software intervention.

A hardware domain specific accelerator may have a narrow focus application compared to a software implementation on a CPU. However, when this hardware implementation is compared to known software implementations, hardware preprocessing can achieve tuple level parallelism and higher performance per cycle. The hardware implementation also improves energy efficiency. Data is processed in a streaming fashion that removes the need for memory storage.

FIG. 1 is a diagram illustrating a system architecture of a storage device, according to an embodiment. A storage device 102 includes a memory controller (MC) (e.g., a double data rate (DDR) MC) 104, a processor 106, an NVMe relative performance (RP) module 108, and an NVMe efficient performance (EP) module 110, each in communication with a network on chip (NOC) 112.

The NOC 112 is also in communication with scan kernel hardware 114. The scan kernel hardware 114 includes a prefetch module 116, an input buffer 118, a preprocessing module 120, a data transposing module 122, a multiplexer (MUX) 124, a scan and filter module 126, and a write memory (mem_wr) module 128. Data is provided from the NVMe EP module 110 to the prefetch module 116 of the hardware scan kernel 114, via the NOC 112. The data is then provided to the input buffer 118, and then processed in the preprocessing module 120 and/or the data transposing module 122, based on the mode of the scan kernel. The parallel paths are multiplexed at the MUX 124, before data is provided to the scan and filter module 126 and the write memory module 128, which returns data to the MC 104. The scan kernel hardware 114 also includes parameters 130.

The combined software/hardware co-design and balanced performance and flexibility performs better than the CPU on a per cycle basis, and the deployment near data storage reduces unnecessary data movement and saves energy.

Figure 2:
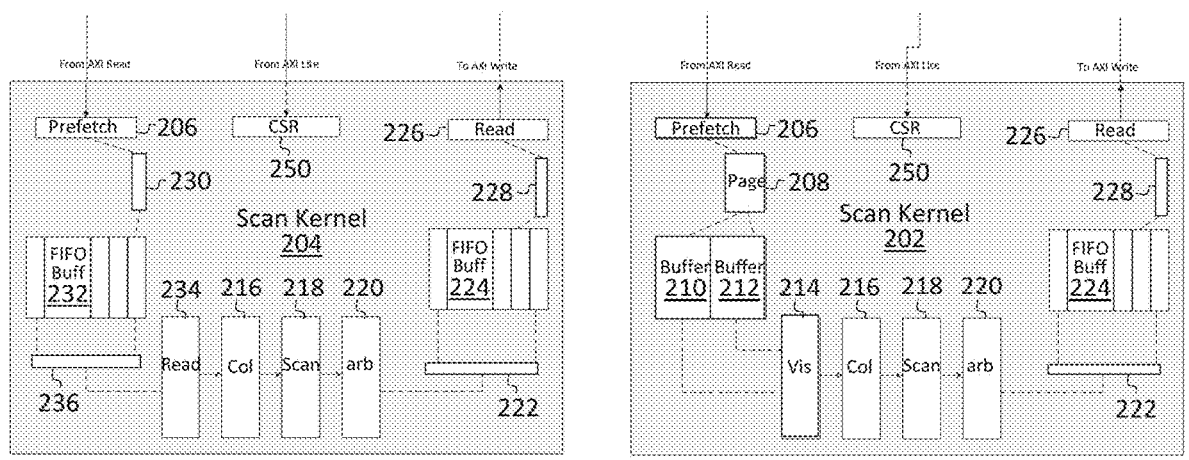
FIG. 2 is a diagram illustrating two modes of the scan kernel of FIG. 1, according to an embodiment.

FIG. 2 is a diagram illustrating two modes of the scan kernel of FIG. 1, according to an embodiment. The configurable structure efficiently hides data movement latency from the subsequent scan and filter pipeline. In a first mode (e.g., a Postgres mode), the input buffer uses a ping-pong scheme to hide data loading latency. In a second mode (e.g., a columnar mode), the input buffer performs column-to-row transposing in order to scan and filter in parallel.

A scan kernel 202 in the first mode uses a ping-pong scheme to hide data loading latency. A prefetch module 206 (e.g., the prefetch module 116 of FIG. 1) obtains data through an advanced extensible interface (AXI)-read, and provides an 8 Kilobyte (KB) page 208 to a ping-pong, or dual memory, buffer 210 and 212. The page 208 is described in greater detail below with respect to FIG. 3. Tuple extraction is performed at a visibility module 214 (e.g. the preprocessing module 120 of FIG. 1). Columns are populated at column module 216 and scanned at a scan module 218. An arb module 220 provides a row 222 to an output FIFO buffer 224. The modules 216, 218, and 220, and the output FIFO buffer 224 may correspond to the scan and filter module 126 of FIG. 1. An output column read module 226 obtains a column 228 from the output FIFO buffer 224, and returns the column via an AXI-write. The hardware scan kernel 202 also includes a control and status register (CSR) 250 that receives data via an AXI-lite interface.

For a scan kernel 204 in the second mode, the prefetch module 206 obtains a column 230 that is then provided to an input FIFO buffer 232. An input column read module 234 obtains a row 236 from the input FIFO buffer 232. This action corresponds to the data transpose module 122 of FIG. 1. The scan kernel 204 in the second mode then follows a similar processing pipeline to that described above for the scan kernel 202 in the first mode.

Figure 3:
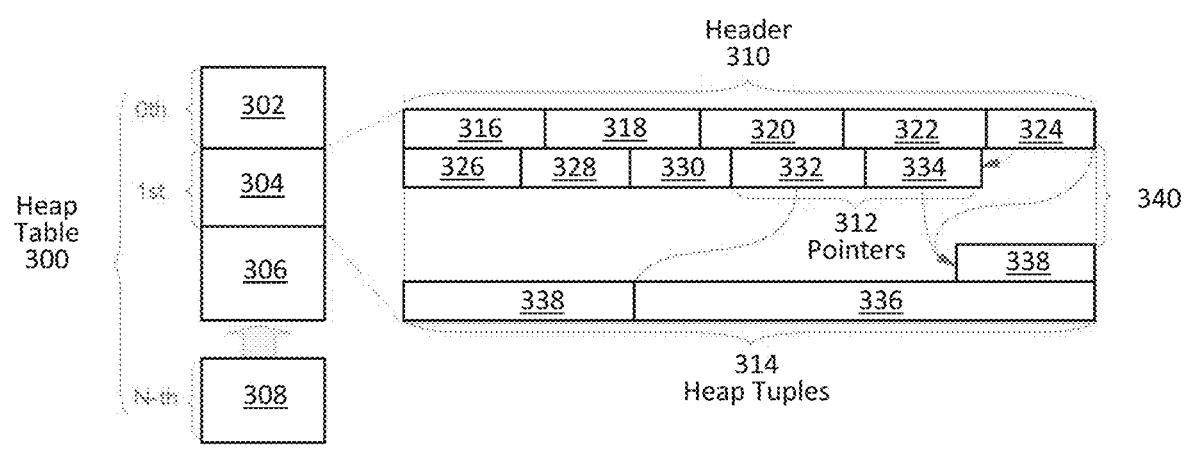
FIG. 3 is a diagram illustrating a page layout of a heap table file.

FIG. 3 is a diagram illustrating a page layout of a heap table file. A heap table file 500 is conventionally used in Postgres and divided into pages or maps of a fixed length (e.g., 302, 304, 306, and 308). A page corresponds to the page 208 of FIG. 2. A default length may be 8192 bytes, or 8 KB. Pages are numbered as $0^{th}$ through $N^{th}$ blocks. Each page (e.g., $1^{st}$ page 304) includes three types of information, header information 310, line pointers 312, and heap tuples 314. The header information 310 is 24 bytes long, contains general information about the page 304, and is allocated at the beginning of the page 304.

The header information 310 includes a pd_lsn parameter 316 that stores a log sequence number (LSN), a pd_checksum parameter 318 that stores a checksum value, a pd_flags parameter 320, a pd_lower parameter 322 that points to an end of the line pointers, a pd_upper parameter 324 that points to a beginning of a newest heap tuple, a pd_special parameter 326 that points to an end of the page, a pd_pagesize_version parameter 328, and a pd_prune_xid parameter 330.

A first line pointer 332 defines a beginning of a first tuple 336 within the page 304. A second line pointer 334 defines a beginning of a second tuple 338 within the page 304. The first tuple 336 and the second tuple 338 are stacked from an end of the page 304 in a reverse manner, leaving free space 340 between an end of the last line pointer and a beginning of a last tuple.

Figure 4:
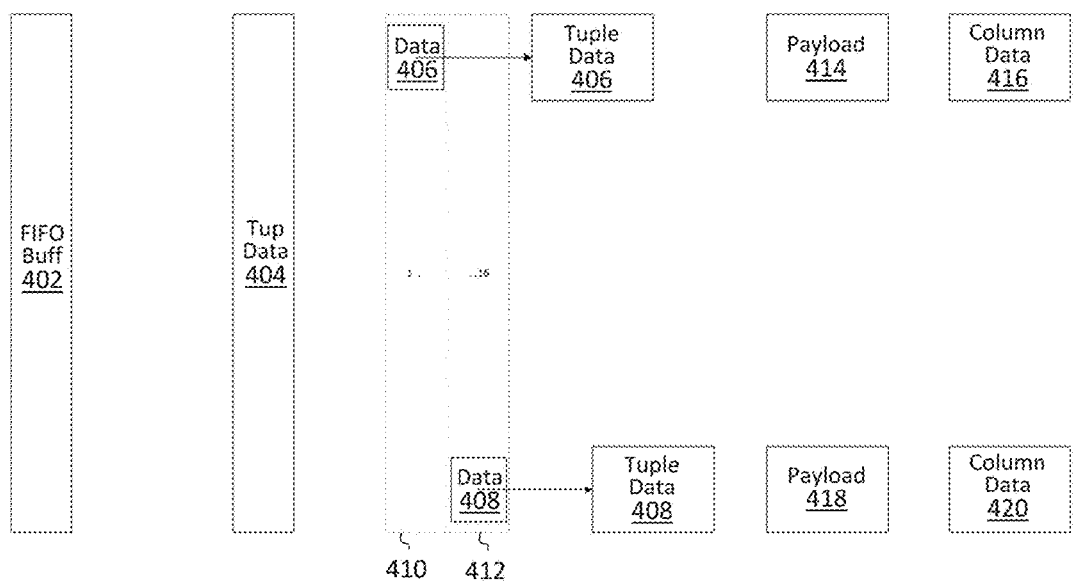
FIG. 4 is a diagram illustrating scalable domain specific preprocessing, according to an embodiment.
Figure 5:
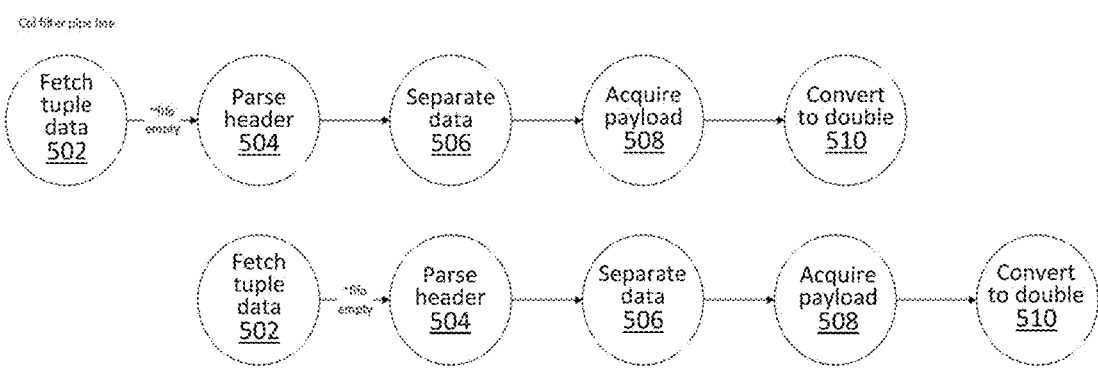
FIG. 5 is a flowchart illustrating a method for preprocessing, according to an embodiment.

Embodiments implement a hardware-based accelerator that can process database pages natively and efficiently. The accelerator works seamlessly with an offloading application programming interface (API) to perform a row and column filter function, and outputs a generic column format for a sequential scan function to perform scan and filter for each query. The preprocessing takes advantage of tuple level parallelism and can scale to a higher performance solution where processing technology allows. A high efficiency column-based scan will result in intermediate results that need to be post-processed in separate iterations FIG. 4 is a diagram illustrating scalable domain specific preprocessing, according to an embodiment. FIG. 5 is a flowchart illustrating a method for preprocessing, according to an embodiment. Specifically, FIGS. 4 and 5 are a detailed description of the preprocessing module 120 of FIG. 1, while in the scan kernel 202 is in the first mode (e.g., Postgres mode).

At 502 of FIG. 5, tuple data 404 is fetched from a FIFO buffer 402. At 504, a header is parsed and a slice index is calculated. At 506, the tuple data 404 is separated into a column register. For example, first tuple data 406 is provided to a first column register 410 corresponding to a first column, and second tuple data 408 is provided to a second column register 412 correspond to a $16^{th}$ column. Column registers between the first and $16^{th}$ column registers may also be populated with corresponding data. At 508, a payload 414 is acquired by slicing user data 406 based on data type, thereby removing the header. At 510, numeric data is converted to double, if required, to provide 8-byte column data 416. A similar procedure may be performed in parallel for each of the 16 columns, as noted by the parallel path in FIG. 5. For example, a payload 418, acquired from user data 408 of the $16^{th}$ column, is converted to 8-byte column data 420.

The embodiment of FIG. 4 illustrates preprocessing across 16 columns. However, embodiments are not limited to this number of columns. For example, the preprocessing may be performed across 8, 32, or any other number of columns.

Figure 6:
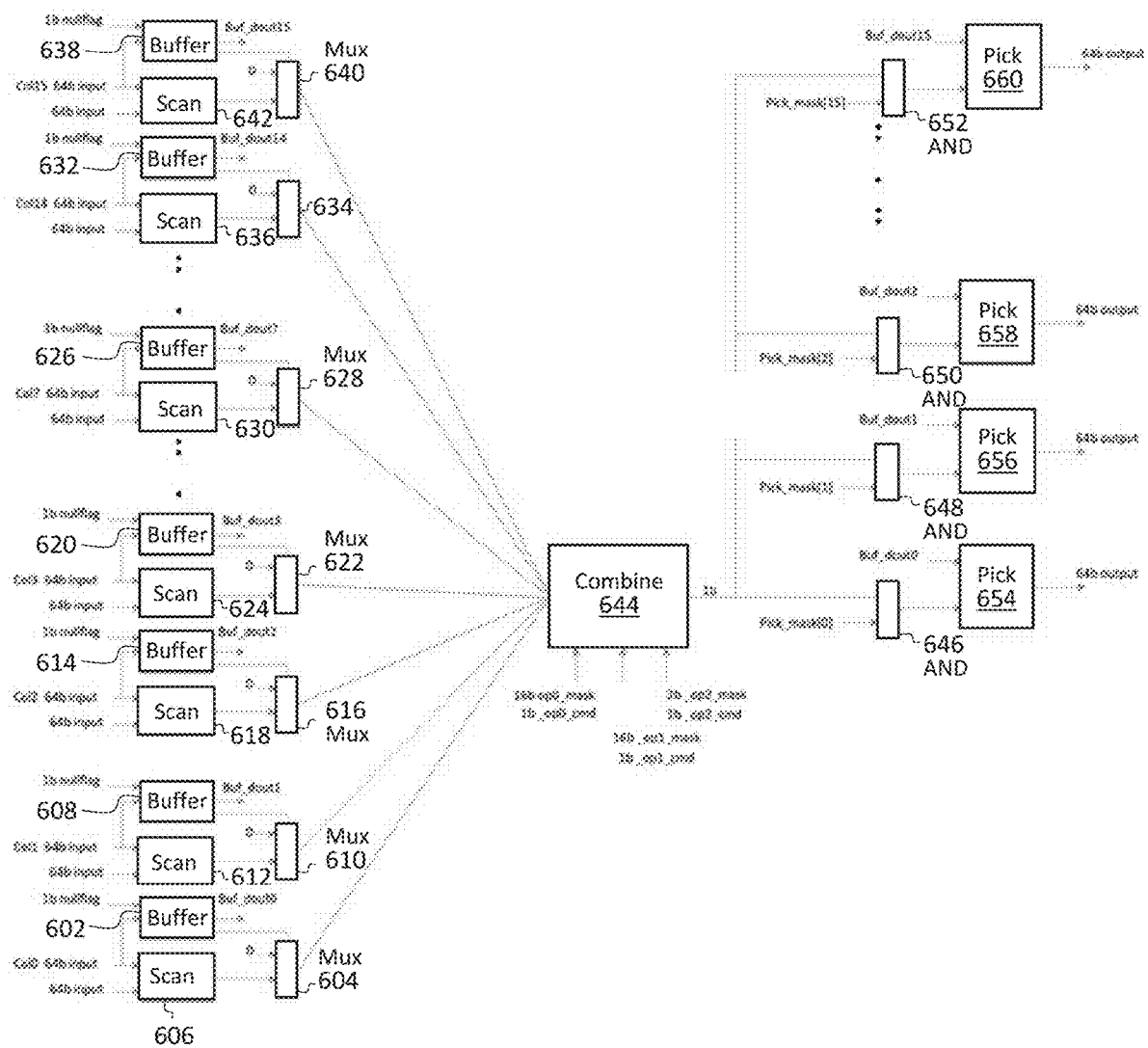
FIG. 6 is a diagram illustrating inline scanning and filtering, according to an embodiment.

FIG. 6 is a diagram illustrating inline scanning and filtering, according to an embodiment. Specifically, the inline scan and filter operations are handled in a single streaming path and correspond to the scan and filter module 126 of FIG. 1.

The embodiment of FIG. 6 illustrates a parallel scanning operation across 16 columns. However, embodiments are not limited to this number of columns. For example, the parallel scanning operation may be performed across 8, 32, or any other number of columns.

As shown, each of the 16 columns are scanned at a respective comparator having a FIFO buffer, a multiplexer, and a scan module. For a $0^{th}$ column, a 1-bit null flag and 64-bit $0^{th}$ column input are provided into a first 64-bit×32 FIFO buffer 602, which provides output to a first multiplexer 604. The 64-bit $0^{th}$ column input and an additional 64-bit input are provided to a first scan module 606, which also provides output to the multiplexer 604.

Similar operations are performed in parallel for each of the $1^{st}$ through $15^{th}$ columns using respective FIFO buffers, multiplexers, and scan modules. For example, a comparator for the $1^{st}$ column includes a second FIFO buffer 608, a second multiplexer 610, and a second scan module 612. A comparator for the $2^{nd}$ column includes a third FIFO buffer 614, a third multiplexer 616, and a third scan module 618. A comparator for the $3^{rd}$ column includes fourth FIFO buffer 620, a fourth multiplexer 622, and a fourth scan module 624. A comparator for the $7^{th}$ column includes a fifth FIFO buffer 626, a fifth multiplexer 628, and a fifth scan module 630. A comparator for the $14^{th}$ column includes a sixth FIFO buffer 632, a sixth multiplexer 634, and a sixth scan module 636. A comparator for the $15^{th}$ column includes a seventh FIFO buffer 638, a seventh multiplexer 640, and a seventh scan module 642.

Multiplexed 64-bit output is provided from each multiplexer to a combine module 644, which also receives operational codes and outputs a single bit. Accordingly, 16 input streams, one for each column, are scanned concurrently.

The single bit is provided in combination with a respective pick mask to a corresponding AND module for each column. For example, the single bit is combined with a pick_mask for the $0^{th}$ column at a first AND module 646. The single bit is combined with a pick_mask for the $1^{st}$ column at a second AND module 648. The single bit is combined with a pick_mask for the $2^{nd}$ column at the third AND module 650. The single bit is combined with a pick_mask for the $15^{th}$ column at the fourth AND module 652.

A result from each AND module is provided to a pick module for the respective column along with the FIFO buffer output for the column. For example, a result from the first AND module 646 and output from the first FIFO buffer 602 are provided to a first pick module 654. A result from the second AND module 648 and output from the second FIFO buffer 608 are provided to a second pick module 656. A result from the third AND module 650 and output from the third FIFO buffer 614 are provided to a third pick module 658. A result from the fourth AND module 652 and output from the seventh FIFO buffer 638 are provided to a fourth pick module 660. Each pick module provides a 64-bit output. Accordingly, scan and pick, or filter, operations are performed in a single streaming path.

The parallel sequential scan architecture processes multiple terms in a query in a same cycle. The results directly apply to a filter function, greatly reducing output volumes. This in-line processing capability improves operation efficiency by not storing data back at a memory. As a basic example, column data may be scanned based on ages, and resulting data may be filtered based on name and address.

Compared to the software instruction-based approach on the CPU, the embodiment takes advantage of data path level parallelism and can be scaled-up to what processing technology allows.

Figure 7:
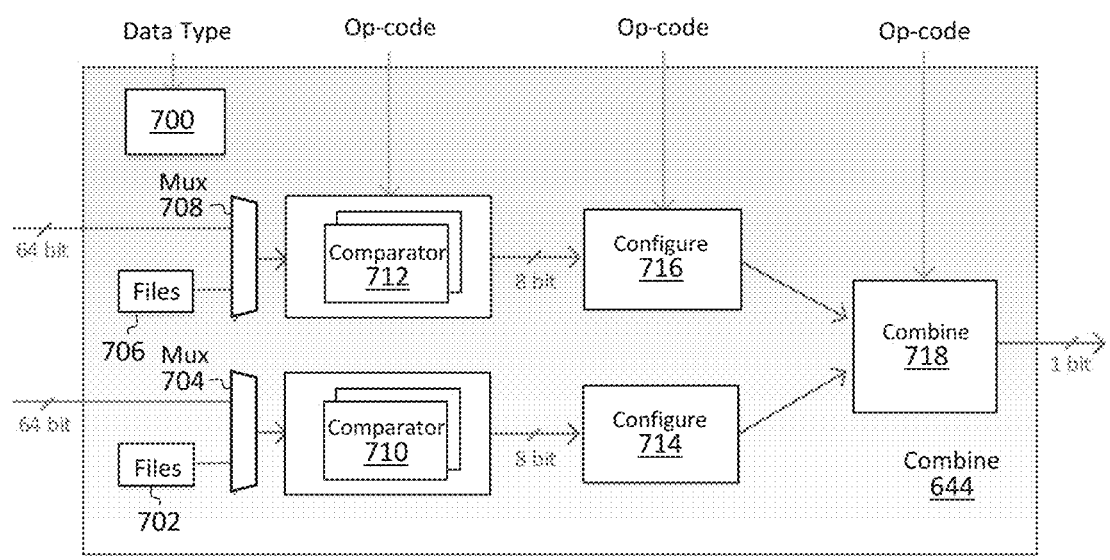
FIG. 7 is a diagram illustrating the combine module of FIG. 6, according to an embodiment.

FIG. 7 is a diagram illustrating the combine module of FIG. 6, according to an embodiment. A data type 700 is provided to the combine module 644. As described with respect to FIG. 6, multiplexed 64-bit output for each column is also provided to the combine module 644. Each 64-bit output and respective registry files are provided to a respective multiplexer. For example, a first 64-bit output and first registry files 702 are provided to a first multiplexer 704, and a second 64-bit output and second registry files 706 are provided to a second multiplexer 708. Similar operations may be performed for the remaining columns.

Multiplexed output and a first operation code are provided to a respective comparator module. For example, output from the first multiplexer 704 and the first operational code are provided to a first comparator module 710, and output from the second multiplexer 708 and the first operational code are provided to a second comparator module 712. The first operational code includes a 16-bit operational mask and 1-bit operational command.

Resulting 8 bits from the comparator modules are provided to respective configure modules with a second operational code, which includes a 16-bit operational mask and a 1-bit operational command. For example, 8 bits from the first comparator module 710 are provided to a first configure module 714, and 8 bits from the second comparator module 712 are provided to a second configure module 716. Configured results from the first configured module 414 and the second configure module 716 are then combined at a module 718 along with a third operational code, which is a 2-bit operational mask and a 1-bit operational command. This results in the single bit output from the combine module 644.

Figure 8:
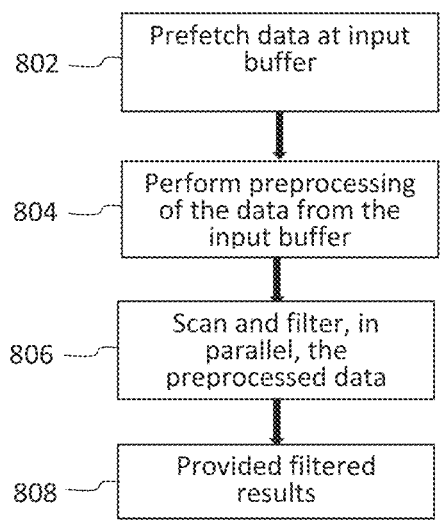
FIG. 8 is a flowchart illustrating a method of operating a memory device, according to an embodiment.

FIG. 8 is a flow chart illustrating a method for performing a scanning operation, according to an embodiment. At 802, data is prefetched for the scanning operation at an input buffer of a scan kernel in a memory device. The input buffer is adaptable to a first mode and a second mode of the scan kernel. The input buffer is embodied as a ping-pong buffer in the first mode of the scan kernel, and as a columnar FIFO buffer in the second mode of the scan kernel.

At 804, data-specific preprocessing of the data from the input buffer is performed to generate preprocessed data. A different type of preprocessing is performed for each of the first mode and the second mode. In the first mode, a page format of the data is preprocessed through the ping-pong buffer, and tuple extraction is performed. The preprocessing is performed in parallel across columns. In the second mode, the data is transposed from a column-based format to a row-based format through the columnar FIFO buffer.

At 806, the preprocessed data is scanned and filtered to generate a filtered result. Data is scanned from multiple columns in parallel to generate a scanning result for each column, the scanning results are combined, and the data from the multiple columns is filtered in parallel based on the combined scanning results. At 808, the filtered result is provided from the scan kernel to a controller of the memory device.

Figure 9:
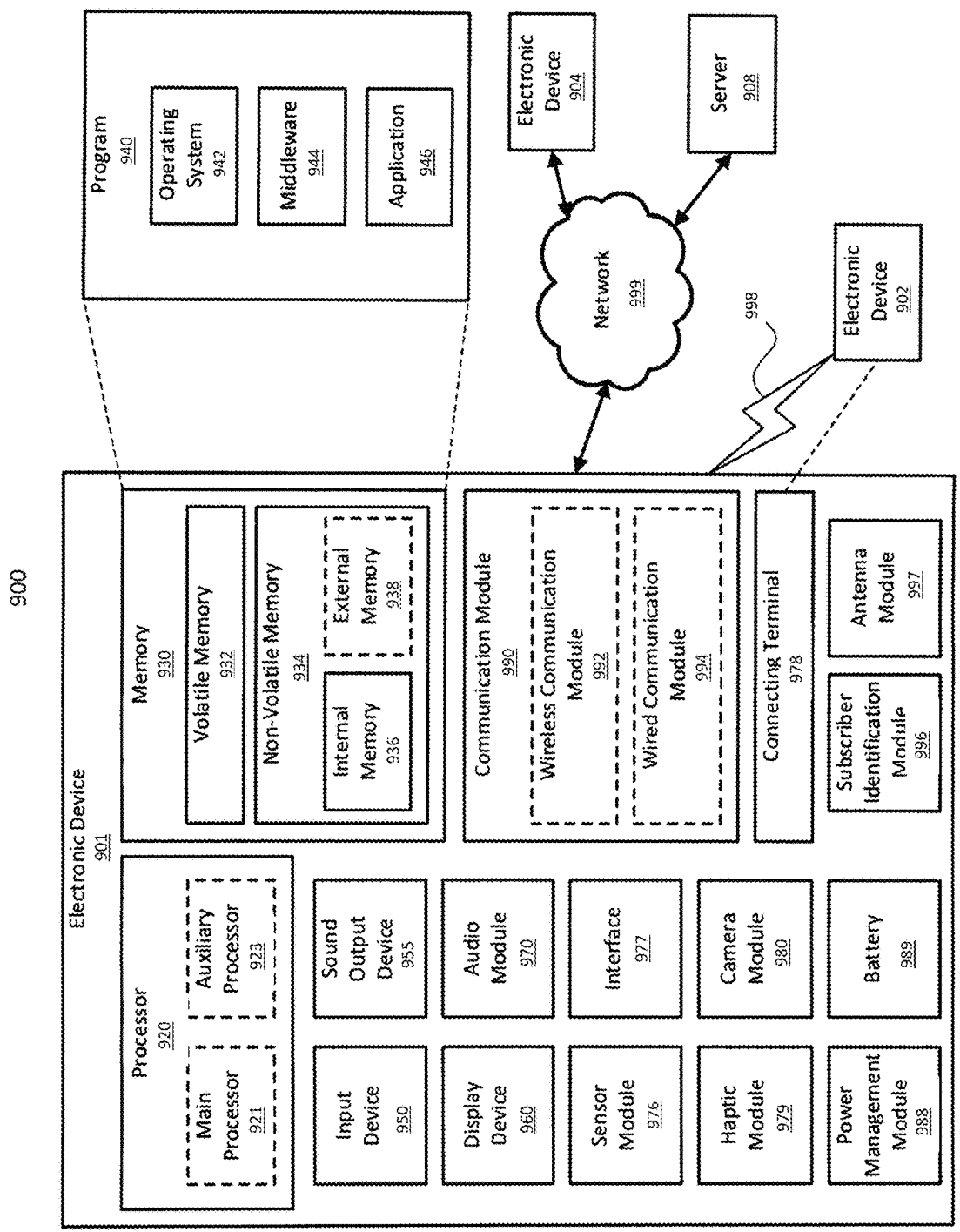
FIG. 9 illustrates a block diagram of an electronic device in a network environment, according to one embodiment.

FIG. 9 illustrates a block diagram of an electronic device 901 in a network environment 900, according to one embodiment. Referring to FIG. 9, the electronic device 901 in the network environment 900 may communicate with an electronic device 902 via a first network 998 (e.g., a short-range wireless communication network), or an electronic device 904 or a server 908 via a second network 999 (e.g., a long-range wireless communication network). The electronic device 901 may communicate with the electronic device 904 via the server 908. The electronic device 901 may include a processor 920, a memory 930, an input device 950, a sound output device 955, a display device 960, an audio module 970, a sensor module 976, an interface 977, a haptic module 979, a camera module 980, a power management module 988, a battery 989, a communication module 990, a subscriber identification module (SIM) 996, or an antenna module 997. In one embodiment, at least one (e.g., the display device 960 or the camera module 980) of the components may be omitted from the electronic device 901, or one or more other components may be added to the electronic device 901. In one embodiment, some of the components may be implemented as a single integrated circuit (IC). For example, the sensor module 976 (e.g., a fingerprint sensor, an iris sensor, or an illuminance sensor) may be embedded in the display device 960 (e.g., a display).

The processor 920 may execute, for example, software (e.g., a program 940) to control at least one other component (e.g., a hardware or a software component) of the electronic device 901 coupled with the processor 920, and may perform various data processing or computations. The processor may correspond to command processor 222 of FIGS. 2A-2C, or the combination of the arbiter 202, the command fetcher 204, the set-aside buffer 230, the command parser 220, and the command processor 222 of FIGS. 2A-2C. As at least part of the data processing or computations, the processor 920 may load a command or data received from another component (e.g., the sensor module 976 or the communication module 990) in volatile memory 932, process the command or the data stored in the volatile memory 932, and store resulting data in non-volatile memory 934. The processor 920 may include a main processor 921 (e.g., a CPU or an application processor (AP)), and an auxiliary processor 923 (e.g., a graphics processing unit (GPU), an image signal processor (ISP), a sensor hub processor, or a communication processor (CP)) that is operable independently from, or in conjunction with, the main processor 921.

Additionally or alternatively, the auxiliary processor 923 may be adapted to consume less power than the main processor 921, or execute a particular function. The auxiliary processor 923 may be implemented as being separate from, or a part of, the main processor 921.

The auxiliary processor 923 may control at least some of the functions or states related to at least one component (e.g., the display device 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to one embodiment, the auxiliary processor 923 (e.g., an image signal processor or a communication processor) may be implemented as part of another component (e.g., the camera module 980 or the communication module 990) functionally related to the auxiliary processor 923.

The memory 930 may store various data used by at least one component (e.g., the processor 920 or the sensor module 976) of the electronic device 901. The various data may include, for example, software (e.g., the program 940) and input data or output data for a command related thereto. The memory 930 may include the volatile memory 932 or the non-volatile memory 934.

The program 940 may be stored in the memory 930 as software, and may include, for example, an operating system (OS) 942, middleware 944, or an application 946.

The input device 950 may receive a command or data to be used by another component (e.g., the processor 920) of the electronic device 901, from the outside (e.g., a user) of the electronic device 901. The input device 950 may include, for example, a microphone, a mouse, or a keyboard.

The sound output device 955 may output sound signals to the outside of the electronic device 901. The sound output device 955 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 960 may visually provide information to the outside (e.g., a user) of the electronic device 901. The display device 960 may include, for example, a display, a hologram device, or a projector and control circuitry to control a corresponding one of the display, hologram device, and projector. According to one embodiment, the display device 960 may include touch circuitry adapted to detect a touch, or sensor circuitry (e.g., a pressure sensor) adapted to measure the intensity of force incurred by the touch.

The audio module 970 may convert a sound into an electrical signal and vice versa. According to one embodiment, the audio module 970 may obtain the sound via the input device 950, or output the sound via the sound output device 955 or a headphone of an external electronic device 902 directly (e.g., wired) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. The sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device 902 directly (e.g., wired) or wirelessly. According to one embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device 902. According to one embodiment, the connecting terminal 978 may include, for example, an HDMI connector, a USB connector, an SD card connector, or an audio connector (e.g., a headphone connector).

The haptic module 979 may convert an electrical signal into a mechanical stimulus (e.g., a vibration or a movement) or an electrical stimulus which may be recognized by a user via tactile sensation or kinesthetic sensation. According to one embodiment, the haptic module 979 may include, for example, a motor, a piezoelectric element, or an electrical stimulator.

The camera module 980 may capture a still image or moving images. According to one embodiment, the camera module 980 may include one or more lenses, image sensors, image signal processors, or flashes.

The power management module 988 may manage power supplied to the electronic device 901. The power management module 988 may be implemented as at least part of, for example, a power management integrated circuit (PMIC).

The battery 989 may supply power to at least one component of the electronic device 901. According to one embodiment, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the AP) and supports a direct (e.g., wired) communication or a wireless communication. According to one embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or a standard of the Infrared Data Association (IrDA)) or the second network 999 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The antenna module 997 may transmit or receive a signal or power to or from the outside (e.g., the external electronic device) of the electronic device 901. According to one embodiment, the antenna module 997 may include one or more antennas, and, therefrom, at least one antenna appropriate for a communication scheme used in the communication network, such as the first network 998 or the second network 999, may be selected, for example, by the communication module 990 (e.g., the wireless communication module 992). The signal or the power may then be transmitted or received between the communication module 990 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 901 and the external electronic device 904 via the server 908 coupled with the second network 999. Each of the electronic devices 902 and 904 may be a device of a same type as, or a different type, from the electronic device 901. All or some of operations to be executed at the electronic device 901 may be executed at one or more of the external electronic devices 902, 904, or 908. For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, or client-server computing technology may be used, for example.

One embodiment may be implemented as software (e.g., the program 940) including one or more instructions that are stored in a storage medium (e.g., internal memory 936 or external memory 938) that is readable by a machine (e.g., the electronic device 901). For example, a processor of the electronic device 901 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 10:
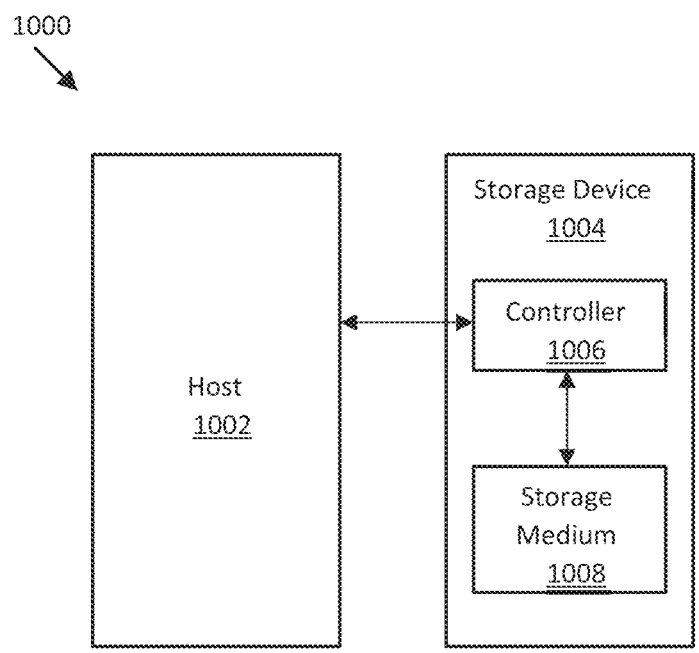
FIG. 10 illustrates a diagram of a storage system, according to an embodiment.

FIG. 10 illustrates a diagram of a storage system 1000, according to an embodiment. The storage system 1000 includes a host 1002 and a storage device 1004. Although one host and one storage device is depicted, the storage system 1000 may include multiple hosts and/or multiple storage devices. The storage device 1004 may be a solid state device (SSD), a universal flash storage (UFS), etc. The storage device 1004 includes a controller 1006 and a storage medium 1008 connected to the controller 1006. The controller 1006 may be an SSD controller, a UFS controller, etc. The storage medium 1008 may include a volatile memory, a non-volatile memory, or both, and may include one or more flash memory chips (or other storage media). The controller 1006 may include one or more processors, one or more error correction circuits, one or more field programmable gate arrays (FPGAs), one or more host interfaces, one or more flash bus interfaces, etc., or a combination thereof. The controller 1006 may be configured to facilitate transfer of data/commands between the host 1002 and the storage medium 1008. The host 1002 sends data/commands to the storage device 1004 to be received by the controller 1006 and processed in conjunction with the storage medium 1008. As described herein, the methods, processes and algorithms may be implemented on a storage device controller, such as controller 1006. The arbiters, command fetchers, and command processors may be implemented in the controller 1006 of the storage device 1004, and the processors and buffers may be implemented in the host 1002.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method of a memory device, comprising:
obtaining data for a scan operation at an input buffer of a scan kernel in the memory device, wherein the input buffer is adaptable to a first mode and a second mode of the scan kernel;
performing preprocessing of the data from the input buffer to generate preprocessed data, wherein a different type of preprocessing is performed for the first mode and the second mode;
filtering the preprocessed data to generate a filtered result; and
providing the filtered result from the scan kernel to a controller of the memory device.

2. The method of claim 1, wherein the input buffer is a dual memory buffer in the first mode of the scan kernel, and the input buffer is a columnar first-in first-out (FIFO) buffer in the second mode of the scan kernel.

3. The method of claim 2, wherein performing preprocessing of the data comprises one of:
in the first mode, processing a page format of the data through the dual memory buffer and performing tuple extraction; or
in the second mode, converting the data from a column-based format to a row-based format through the columnar FIFO buffer.

4. The method of claim 3, wherein processing the page format comprises:
obtaining tuple data of the page format from the dual memory buffer;
separating the tuple data into corresponding column registers;
acquiring payloads of the separated tuple data; and
converting the payloads into column data.

5. The method of claim 4, wherein processing the page format is performed in parallel across columns.

6. The method of claim 4, wherein acquiring the payloads comprises separating the payloads from the separated tuple data.

7. The method of claim 4, wherein a number of the column registers corresponds to a number of the columns in the dual memory buffer.

8. The method of claim 1, wherein filtering the preprocessed data comprises:
scanning data from columns in parallel to generate a scanning result for each column;
combining the scanning results; and
filtering the data from the columns in parallel based on the combined scanning results.

9. The method of claim 8, wherein the scanning, combining, and filtering are performed in-line.

10. The method of claim 8, wherein the scanning results are combined at a combine module that outputs a single bit.

11. A memory device, comprising:
a controller; and
scan kernel hardware;
wherein the scan kernel hardware is configured to:
obtain data for a scan operation at a input buffer, wherein the input buffer is adaptable to a first mode and a second mode of a scan kernel;
perform preprocessing of the data from the input buffer to generate preprocessed data, wherein a different type of preprocessing is performed for the first mode and the second mode;
filter the preprocessed data to generate a filtered result; and
provide the filtered result from the scan kernel to the controller.

12. The memory device of claim 11, wherein the input buffer is a dual memory buffer in the first mode of the scan kernel, and the input buffer is a columnar first-in first-out (FIFO) buffer in the second mode of the scan kernel.

13. The memory device of claim 12, wherein, in performing preprocessing of the data, the scan kernel hardware is further configured to:
in the first mode, process a page format of the data through the dual memory buffer and perform tuple extraction; or
in the second mode, convert the data from a column-based format to a row-based format through the columnar FIFO buffer.

14. The memory device of claim 13, wherein, in processing the page format, the scan kernel hardware is further configured to:
obtain tuple data of the page format from the dual memory buffer;
separate the tuple data into corresponding column registers;
acquire payloads of the separated tuple data; and
convert the payloads into column data.

15. The memory device of claim 14, wherein processing the page format is performed in parallel across columns.

16. The memory device of claim 14, wherein, in acquiring the payloads, the scan kernel hardware is further configured to separate the payloads from the separated tuple data.

17. The memory device of claim 14, wherein a number of the column registers corresponds to a number of the columns in the dual memory buffer.

18. The memory device of claim 11, wherein, in filtering the preprocessed data, the scan kernel hardware is further configured to:
scan data from columns in parallel to generate a scanning result for each column;
combine the scanning results; and
filter the data from the columns in parallel based on the combined scanning results.

19. The memory device of claim 18, wherein the scanning, combining, and filtering are performed in-line.

20. A memory device, comprising:
a controller;
a network on chip (NoC); and
scan kernel hardware,
wherein the scan kernel hardware is configured to:
perform preprocessing of data, received via the NoC, using an input buffer to generate preprocessed data, wherein the input buffer is adapted differently for a first mode or a second mode of a scan kernel;
filter the preprocessed data to generate a filtered result; and
provide the filtered result from the scan kernel to the controller via the NoC.

* * * * *